United States Patent [19]
Zimmermann

[11] Patent Number: 5,506,508
[45] Date of Patent: Apr. 9, 1996

[54] APPARATUS FOR DETECTING A SHORTED WINDING CONDITION OF A SOLENOID COIL

[75] Inventor: Daniel E. Zimmermann, Peoria, Ill.

[73] Assignee: Caterpillar Inc., Peoria, Ill.

[21] Appl. No.: 489,240

[22] Filed: Jun. 12, 1995

Related U.S. Application Data

[63] Continuation of Ser. No. 134,708, Oct. 12, 1993, abandoned.

[51] Int. Cl.$^6$ .................................................. G01R 31/06
[52] U.S. Cl. .......................... 324/546; 324/418; 340/644
[58] Field of Search .............................. 329/207.15, 388, 329/418, 546, 547; 340/644, 650

[56] References Cited

U.S. PATENT DOCUMENTS

| | | | |
|---|---|---|---|
| 2,788,486 | 4/1957 | Guggi | 324/546 |
| 3,267,370 | 8/1966 | Praeg | 324/547 |
| 5,059,912 | 10/1991 | Trampert | 324/546 |

FOREIGN PATENT DOCUMENTS

| | | | |
|---|---|---|---|
| 3291573 | 12/1991 | Japan | 324/546 |
| 1663583 | 7/1991 | U.S.S.R. | 324/546 |
| 1684737 | 10/1991 | U.S.S.R. | 324/546 |

*Primary Examiner*—Kenneth A. Wieder
*Assistant Examiner*—Christopher M. Tobin
*Attorney, Agent, or Firm*—David M. Masterson

[57] ABSTRACT

In one aspect of the present invention, an apparatus detects a shorted winding condition of a solenoid coil. The apparatus includes a reference solenoid that is connected to a test solenoid. A sine generator drives the reference solenoid with a sinusoidal waveform to cause an induced voltage across the test solenoid. A meter determines the voltage difference between the solenoids and compares the voltage difference to a predetermined value.

5 Claims, 3 Drawing Sheets

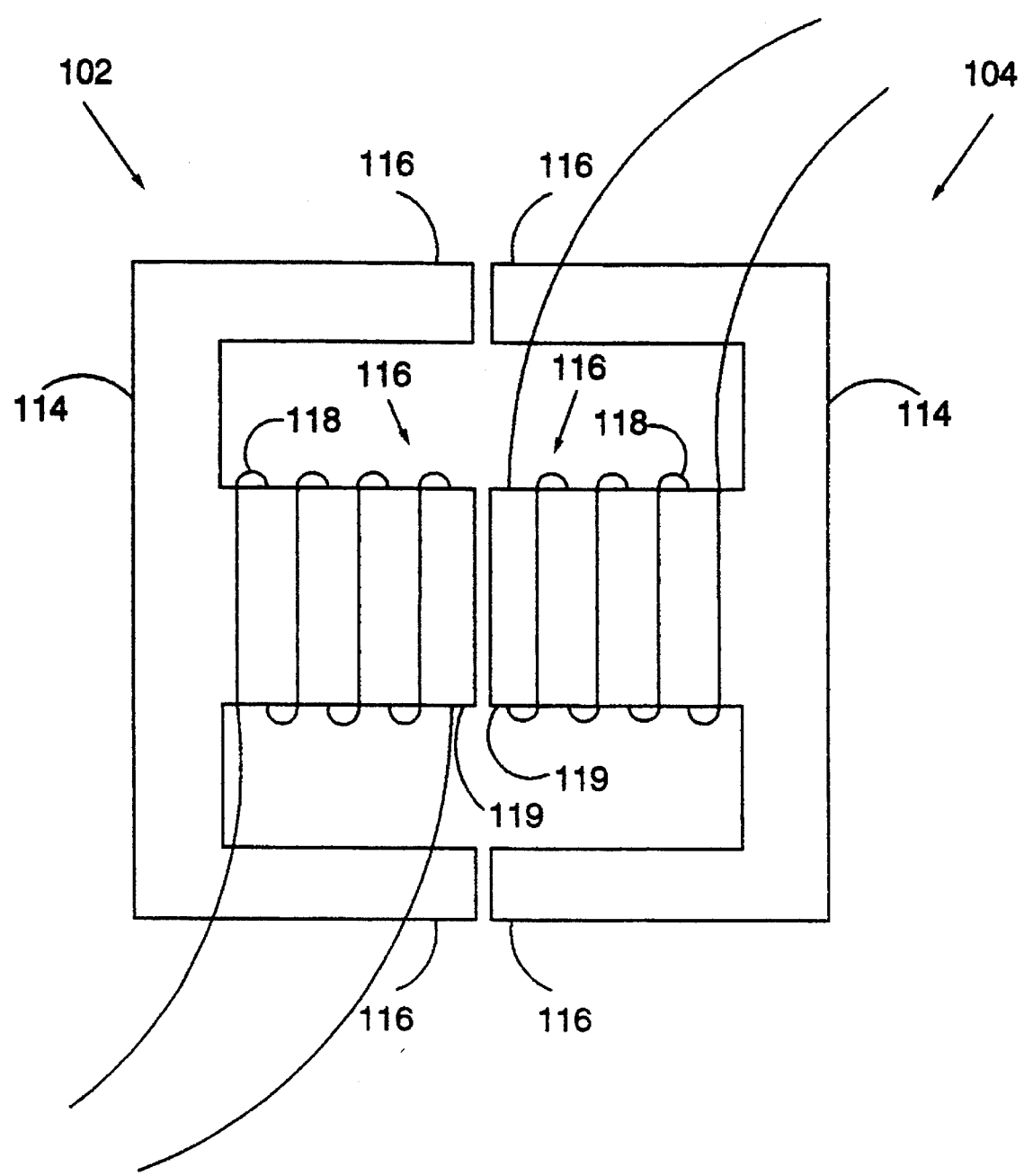
Fig_2

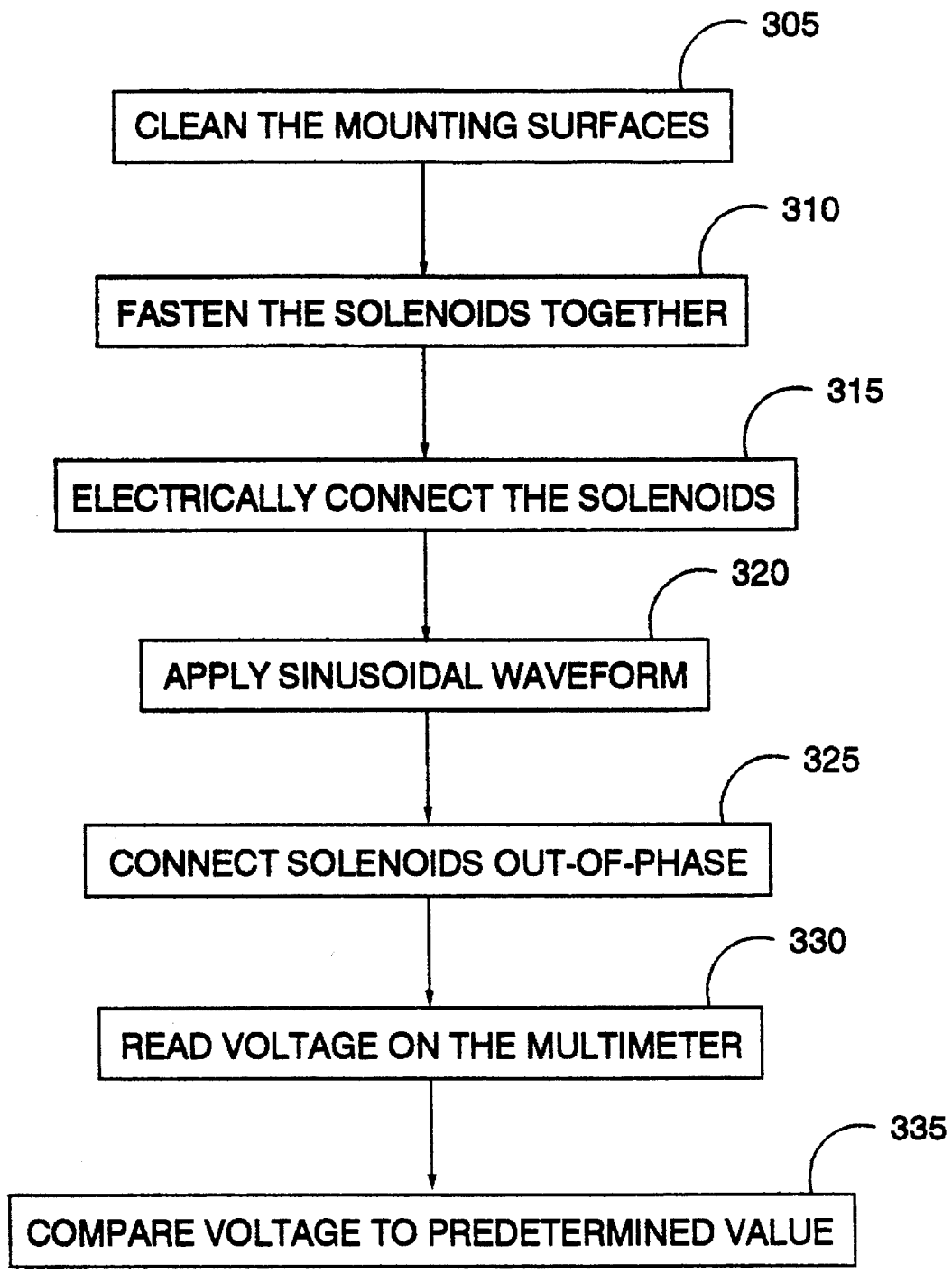

APPARATUS FOR DETECTING A SHORTED WINDING CONDITION OF A SOLENOID COIL

This is a file wrapper continuation of application Ser. No. 08/134,708, filed Oct. 12, 1993, now abandoned.

TECHNICAL FIELD

This invention relates to an apparatus for detecting a shorted winding condition of a solenoid coil.

BACKGROUND ART

Solenoids convert electrical energy into mechanical energy. Because of this phenomenon, solenoids are widely used in a variety of applications. Once such application is to use the solenoid as an actuator for operating a fuel injector of an internal combustion engine. However, as the engine becomes more and more dependent upon sophisticated electronics, it is desirable to detect and diagnose electrical problems. Since the solenoid is such a critical device, it is important to be able to detect its operability. One of the most common solenoid failures results from a shorted winding condition of the solenoid coil. Thus, it is desirable to detect such a condition.

Heretofore, detection of a shorted winding condition of the solenoid coil has been problematic. For example, one technique involves simply measuring the resistance across a test solenoid coil and comparing the measured resistance to a known resistance of a good coil. However, this technique does not produce accurate readings because the resistance change due to a few shorted coil windings is small and is difficult to detect. Another technique involves the use of a surge or ring testing device. This device places a high voltage pulse on a test solenoid coil. The resulting current oscillations are then displayed on an oscilloscope. The pattern of the test coil is compared with the pattern associated with a good coil. Unfortunately, this type of testing device is expensive and is not suitable in remote locations.

The present invention is directed to overcoming one or more of the problems as set forth above.

DISCLOSURE OF THE INVENTION

In one aspect of the present invention, an apparatus detects a shorted winding condition of a solenoid coil. The apparatus includes a reference solenoid that is connected to a test solenoid. A sine generator drives the reference solenoid with a sinusoidal waveform to cause an induced voltage across the test solenoid. A meter determines the voltage difference between the solenoids and compares the voltage difference to a predetermined value.

BRIEF DESCRIPTION OF THE DRAWINGS

For a better understanding of the present invention, reference may be made to the accompanying drawings in which:

FIG. 2 shows the internal construction of a test and reference solenoid; and

FIG. 3 shows a block diagram of a testing procedure associated with the present invention.

BEST MODE FOR CARRYING OUT THE INVENTION

Figure 1:
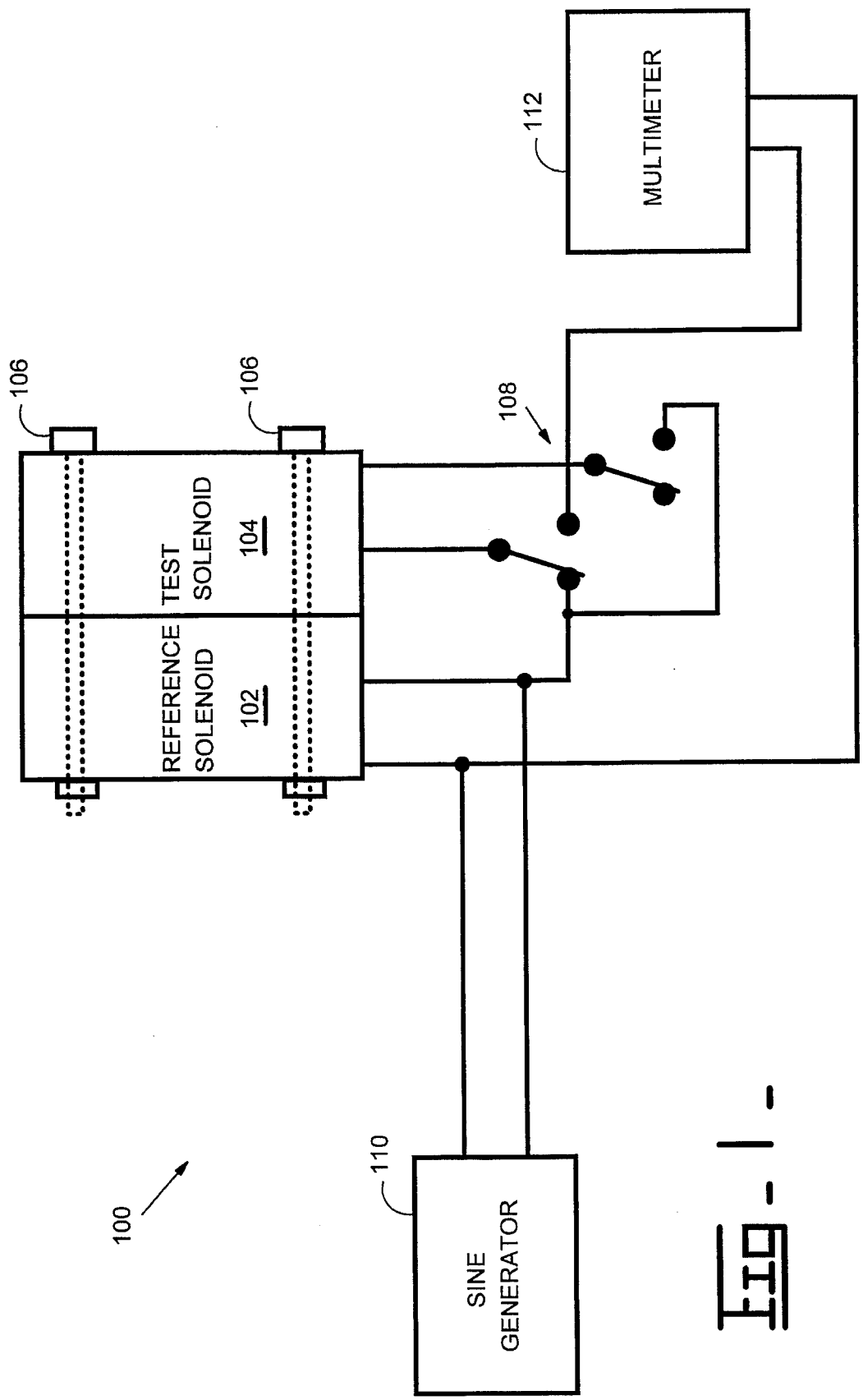
FIG. 1 shows an apparatus for detecting a shorted winding condition of a solenoid coil in accordance with a preferred embodiment of the present invention.

Referring now to the drawings, wherein a preferred embodiment of the present invention is shown, FIG. 1 illustrates an apparatus 100 for detecting a shorted winding condition of a solenoid coil. A reference solenoid 102 is rigidly connected to test solenoid 104, whose coil is suspect. As shown, the solenoids 102,104 are connected via a plurality of bolt/nut assemblies 106. The solenoids are electrically connected in series by a switch 108. The switch 108 is preferably of a two-pole, double-throw design.

A sine generator 110 is connected to the reference solenoid 102 and drives the reference solenoid with a sinusoidal waveform. For example, the sinusoidal waveform may have a frequency of 500 Hz with a peak voltage of 10 volts. Accordingly the current traveling through the reference solenoid 102 induces a voltage in the test solenoid 104, as will be later discussed.

A multimeter 112 measures the voltage across the series connected solenoids. Preferably, the reference solenoid 102 is manufactured with substantially the same number of coil windings as the test solenoid 104. Moreover, the test solenoid should be electrically connected 180° out-of-phase with the reference solenoid to result in a measured voltage that directly represents the voltage difference between the series connected solenoids. This voltage difference is proportional to the coil winding imbalance between the series connected solenoids. The coil winding imbalance is caused by the a shorted winding condition associated with the test solenoid coil.

It is noted that the size, shape and construction of the solenoids are not critical to the present invention. However, the reference solenoid should have a complementary shape to the test solenoid to provide for good magnetic coupling. Shown herein, for example, the solenoids 102,104 are of a E-frame configuration and are similar to that provided by Caterpillar, Inc. as model no. 9X-1500.

Referring now to FIG. 2, the internal construction of the solenoids 102,104 is shown. The solenoids each have a core 114 that is constructed of laminated E-sections that are made of iron. The core 114 defines three spaced-apart pole pieces 116. A coil of windings 118 is wound about the center pole piece 119.

Although the solenoid cores are shown separated, it should be understood that the pole pieces of the test core is contiguous with the pole pieces of the reference core. It follows that, the face of each pole piece 116 is flat to allow for good magnetic coupling.

In operation, a changing current traveling though the reference solenoid coil creates a changing magnetic field in the reference solenoid core. By connecting the test solenoid to the reference solenoid, a magnetic circuit is completed. Thus, the magnetic field produced by the reference coil is intercepted by the test coil, which induces current in the test coil. Assuming that the coils are wound with an equal number of windings, the voltage difference between the two coils should be substantially zero. However, if the test solenoid coil has an unequal number of windings, due to a shorted winding condition, the voltage differential will be proportionally greater.

Industrial Applicability

The operation of the present invention is now described to illustrate the features and advantages associated with the present invention.

The operation is best described in relation to the block diagram of FIG. 3, which illustrates the testing procedure. As shown in block 305, the mounting surfaces of the respective solenoids are cleaned to enhance the coupling properties of the solenoids 102,104. Next at block 310, the solenoids are fastened together in the manner shown in FIG. 1. The solenoids are then electrically connected in series, which is represented by block 315. A sinusoidal waveform is then applied to the reference solenoid 102, shown by block 320.

Block 325 ensures that the solenoids are connected 180° out-of-phase. For example, the switch 108 should be selected to a position that results in a lower reading of the multimeter. The lower reading of the multimeter infers that the two solenoid voltages are in direct opposition. (The switch is provided because not all solenoids of the same type and manufacturer are wound in the same direction.) Once the switch is at the proper position, a final reading of the multimeter is made, shown by block 330. In block 335, the voltage difference is then compared to a predetermined value. If the voltage difference is greater than the predetermined value, the test coil windings are said to be shorted. However, if the voltage difference is less than a predetermined value, then the test solenoid is considered to be satisfactory.

It is noted that under ideal conditions the voltage difference between two solenoids with an equal number of windings is zero. However, under actual conditions a small amount of voltage difference will exist between two solenoids with an equal number of windings. Therefore, a predetermined value slightly above zero volts is selected, 0.20 volts for example.

Other aspects, objects and advantages of the present invention can be obtained from a study of the drawings, the disclosure and the appended claims.

I claim:

1. An apparatus for detecting a shorted winding condition of a solenoid coil, comprising:

a reference solenoid, including:
   a core; and
   a coil wrapped about the core;

a test solenoid, including:
   a core; and
   a coil wrapped about the test solenoid core, wherein the reference and test solenoid coils are manufactured with a substantially equal number of turns, and the reference and test solenoid cores are magnetically coupled to one another;

a sine generator connected across the reference solenoid coil and adapted to drive the reference solenoid with a sinusoidal waveform to cause an induced voltage across the test solenoid; and means for determining the voltage difference between the solenoids to ascertain whether the test coil has a shorted winding condition.

2. An apparatus, as set forth in claim 1, wherein the test solenoid coil is electrically connected in series and 180° out-of-phase with the reference solenoid coil.

3. An apparatus, as set forth in claim 2, wherein the determining means includes a multimeter being electrically connected across the series connected solenoids and adapted to display the voltage differential between the series connected solenoids.

4. An apparatus, as set forth in claim 3, including a two-pole, double-throw switch connected between the series connected solenoids, the switch being adapted to change the phase between the series connected solenoids.

5. An apparatus, as set forth in claim 4, wherein the reference and test solenoids cores each have an E-frame configuration.

* * * * *